United States Patent [19]

Hagon et al.

[11] 4,028,639
[45] June 7, 1977

[54] OSCILLATOR USING MAGNETOSTATIC SURFACE WAVE DELAY LINE

[75] Inventors: Peter J. Hagon, Corona del Mar; John Haworth, Placentia, both of Calif.

[73] Assignee: Rockwell International Corporation, El Segundo, Calif.

[22] Filed: Oct. 3, 1975

[21] Appl. No.: 619,268

[52] U.S. Cl. .............................. 331/107 A; 331/96; 331/155; 333/30 M
[51] Int. Cl.² ............................................ H03B 5/32
[58] Field of Search ............... 331/96, 107 A, 154, 331/155, 135, 136; 333/30 M; 330/5, 5.5

[56] References Cited
UNITED STATES PATENTS

| | | | |
|---|---|---|---|
| 3,577,099 | 5/1971 | Hall | 331/96 |
| 3,864,647 | 2/1975 | Bongianni | 333/30 M |
| 3,894,286 | 7/1975 | Armstrong | 333/30 R |
| 3,935,550 | 1/1976 | Adam et al. | 333/30 M |

*Primary Examiner*—John Kominski
*Attorney, Agent, or Firm*—H. Fredrick Hamann; G. Donald Weber, Jr.; Gilbert H. Friedman

[57] ABSTRACT

An oscillator for operation in the frequency range from about 2 GHz to at least 18 GHz using a magnetostatic surface wave delay line as a frequency control element in a feedback loop connected around an amplifier. The oscillator is tunable by varying the magnetic field intensity at the magnetostatic surface wave propagating medium and by varying the distance between input and output rf couplers along the propagation surface.

2 Claims, 6 Drawing Figures

OSCILLATOR USING MAGNETOSTATIC SURFACE WAVE DELAY LINE

BACKGROUND OF THE INVENTION

1. Field of the Invention

This invention relates to oscillators and more particularly pertains to oscillators wherein the frequency of oscillation is determined and controlled by a magnetostatic surface wave delay line.

2. Description of the Prior Art

A common configuration for an oscillator is one which includes an amplifier having an input port, an output port and a feedback path interconnected from the output port to the input port of the amplifier to form a regenerative loop for at least one frequency of oscillation. In general, such a loop will be regenerative and will oscillate at every frequency for which the total phase shift around the loop is either zero or an integral multiple of $2\pi$ radians and for which the gain around the loop is at least unity. Amplifiers are generally built to have a predetermined gain and phase shift over a fairly broad range of frequencies. However, for most applications, it is required that the frequency of oscillation of an oscillator remain either reasonably constant at a desired value or that the frequency of oscillation be capable of being varied from one desired value to another in a predictable manner. The common practice is to interconnect a frequency control element in the feedback path around the amplifier when building an oscillator conforming to the description given above. Such a frequency control element must have phase shift and gain characteristics which, when combined with those of the amplifier and all other components interconnected in the loop, cause the loop to be regenerative at a desired frequency of oscillation. An example of such a frequency control element is a delay line. Delay lines are well suited for use as frequency control elements in oscillators for which the desired frequency of oscillation is relatively high.

Surface acoustic wave delay lines have been successfully fabricated to operate at frequencies in the range from about 10 megahertz to about 1 gigahertz although a more practical frequency range for the use of these devices is between 50 and 500 megahertz. These delay lines have an advantage in that they can be fabricated to provide a large phase shift in a relatively small, and therefore conveniently useful, package. That is because the speed of propagation of surface acoustic waves on piezoelectric crystals and films is significantly less than the speed of propagation of electromagnetic waves in either free space, waveguides, coaxial cable, or the like.

It is generally accepted that the most practical transducer for converting an electrical signal to a surface acoustic wave propagating on a piezoelectric crystal or film and reconverting the propagated wave to an electrical signal is an interdigital transducer deposited on the surface of the piezoelectric material. As is well-known, the adjacent fingers of the pair of electrodes comprising an interdigital transducer are required to be accurately spaced apart from each other by one-half of a wavelength at a preselected center frequency of operation for the delay line. Also, each such finger is preferably one-quarter of a wavelength wide at this preselected frequency. This fixed geometry for the interdigital input and output transducers is a significant factor in the operation of a surface acoustic wave delay line as a frequency control element when the delay line is interconnected in an oscillator circuit. Well-known photolithographic techniques are used to fabricate interdigital transducers. However, the state-of-the-art of photolithography is limited in terms of its resolution capability. The fabrication of interdigital transducers for use at very small acoustic wavelengths, i.e., at frequencies higher that 1 gigahertz, is currently regarded as impractical. This is one of the factors which determines the upper frequency limit for the application of surface acoustic wave delay lines. In addition, the propagation loss of surface acoustic wave delay lines increases with increasing frequency. At frequencies above about one gigahertz, the relatively large propagation losses of surface acoustic wave delay lines tends to further reduce their desirability for practical application.

Delay lines in which a signal is propagated as a relatively low velocity wave on the surface of some suitable material have utility in applications other than as frequency control elements for oscillators. The magnetostatic surface wave delay line (MSWDL) has received attention from investigators for signal processing applications in the frequency range from about 2 gigahertz up to at least 18 gigahertz. Some practical applications which have been studied or mentioned for MSDWL's are in tunable and tailored filters, pulse compressors, isolators, and delay line equalizers. MSDWL's have the same small-size advantages as surface acoustic wave delay lines due to their relatively low velocity of wave propagation. Although the propagation losses of MSDWL's also increase with increasing signal frequency in the 2 to 18 gigahertz frequency range, these propagation losses are less than those of surface acoustic wave devices and this relatively lower propagation loss advantage for the MSDWL increases with increasing signal frequency.

SUMMARY OF THE INVENTION

The subject invention is a delay line oscillator particularly useful for operation in the frequency range from about 2 GHz to at least 18 GHz. The oscillator uses a magnetostatic surface wave delay line (MSWDL) interconnected in a feedback path from the output port to the input port of an amplifier thereby forming a loop. The MSWDL serves as a frequency control element for the oscillator. The pass band, or frequency characteristic, of the MSWDL is determined by the intensity of a magnetic field established across a slab or film of a ferromagnetic material such as a ferrite. The amplifier has sufficient gain so that the net gain around the loop is at least unity at a frequency of oscillation within the pass band of the MSWDL. The phase shift provided by the MSWDL is usually a large multiple of $2\pi$ radians and is therefore more than sufficient to cause regenerative operation of an oscillator loop thereby causing an output signal to be present at the output port of the amplifier. The location of the pass band of the MSWDL within its most useful range of operating frequencies, that is, 2 GHz to at least 18 GHz, can be varied. The oscillator can be tuned by varying the intensity of the aforementioned magnetic field thereby varying the frequency range of the MSWDL pass band. The total phase shift provided by the MSWDL is determined, in part, by the distance between rf input and output couplers positioned adjacent the propagation surface of the ferromagnetic material. Since the couplers need not be deposited on the propagating surface of ferromagnetic material, the distance between the input and output rf couplers can be held fixed or made variable. When the distance between the rf couplers is made varible, an additional means is provided for tuning the oscillator since the effective length of the delay line may thereby be varied with a resultant change in the phase shift of the signal propagated along the surface of the ferromagnetic material.

BRIEF DESCRIPTION OF THE DRAWINGS

The foregoing and other features of the present invention will be more readily apparent from the drawings and the detailed description which follows. Corresponding reference numerals identify corresponding elements and parts throughout the several figures.

DESCRIPTION OF THE PREFERRED EMBODIMENTS

Figure 1:
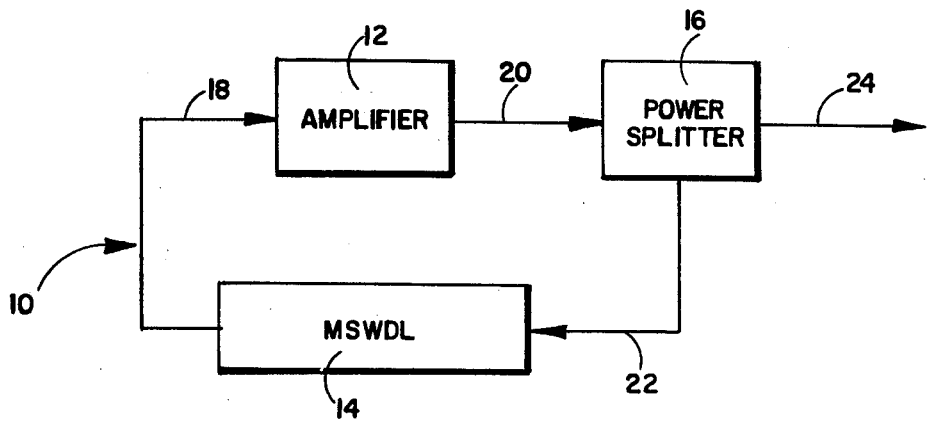
FIG. 1 is a block diagram for a delay line oscillator in accordance with the present invention.

Attention is directed to FIG. 1 wherein a basic MSWDL oscillator 10 in accordance with the invention is illustrated. An amplifier 12, of known configuration, produces an electrical output signal at output port 20 which is coupled to a power splitter 16. The power splitter 16 has a first output cable 22 for coupling a portion of the energy produced by the amplifier 12 to the input port of an MSWDL 14. Typically, the greater portion of the energy developed by the amplifier 12 is delivered by the power splitter 16 to an output cable 24 of the oscillator 10 for connection to a utilization device (not shown). The power splitter 16 may be a resistive voltage divider, a directional coupler, or any other device having a similar function. The amplifier 12 may be any amplifier which is suitable for use in the frequency range of interest such as, for example, a traveling wave tube amplifier.

The electrical signal received by the MSWDL 14 on cable 22 is delayed by the MSDWL 14, and attenuated by losses therein, by magnetostatic surface wave propagation. The signal output of the MSWDL 14 is coupled to the input port of the amplifier 12 by the cable 18. The gain of the amplifier 12 equals or exceeds the attenuation resulting from the operation of the power splitter 16, the losses in the MSWDL 14, and any other losses in the loop.

Of course, it may be permissible to omit power splitter 16 from the oscillator 10 shown in FIG. 1. Nevertheless, in this situation, means must still be provided to connect both the utilization device and the input coupler of the MSDWL 14 to the output port 20 of the amplifier 12.

In any system such as the delay line oscillator 10 of the subject invention, it may sometimes be convenient, and frequently necessary, to provide the elements used therein with a capability for adjustment in order to produce a desired result such as oscillation at a particular preselected frequency. The oscillator 10 of FIG. 1 has been redrawn in FIG. 2 for the purpose of indicating certain adjustment features which may be incorporated therein. For example, the amplifier 12 has been drawn with an arrow through it to indicate that the amplifier 12 may be provided with adjustable gain. As the gain of the amplifier 12 is reduced or increased, the frequency of oscillation will tend to change due to the curvature of the frequency characteristic of the MSDWL 14. For example, as the gain is increased, oscillations will be sustainable at a frequency for which the insertion losses of the MSWDL 14 are greater.

Figure 2:
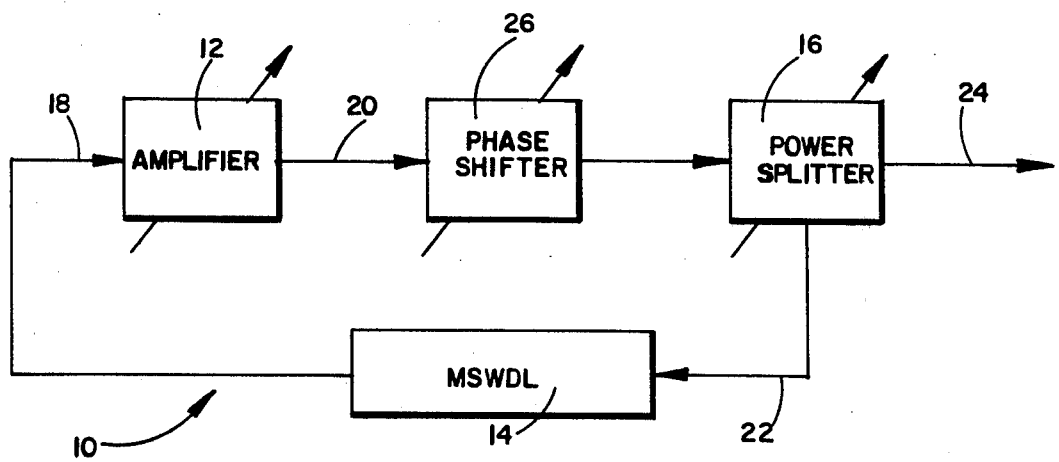
FIG. 2 is a block diagram for a delay line oscillator in accordance with the present invention, the oscillator having components for which certain parameters are made variable.

A similar result can be obtained by making the power splitter 16 adjustable, as indicated by the arrow drawn through it in FIG. 2, to deliver less or more of the amplifier output signal to the MSWDL 14 input coupler by way of cable 22. As assembled, a particular MSWDL 14 may not produce precisely that amount of delay for which the total phase shift around the oscillator loop is an integral multiple of $2\pi$ radians at the desired frequency of oscillation. Therefore, there has been included in the oscillator loop of FIG. 2 a diagrammatic representation of a variable phase shifter 26 for making relatively small adjustments to the loop phase shift. The variable phase shifter 26 may be a line stretcher, a varactor phase shifter, or any other device having a similar function. The phase shifter 26 may be fabricated as a separate entity as shown in FIG. 2. or be integrally combined in the circuitry of the amplifier 12, as desired.

Figure 3:
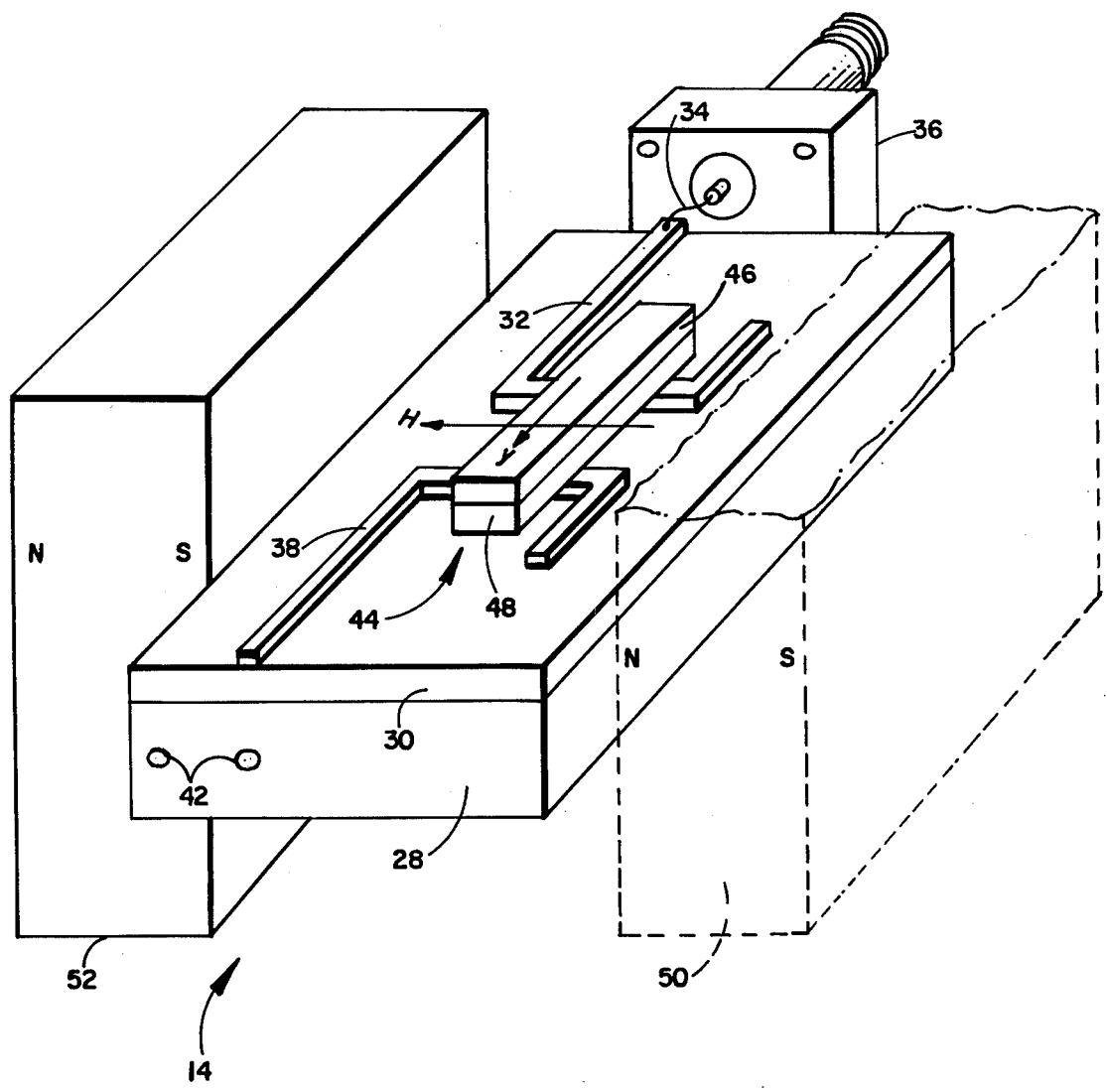
FIG. 3 is a perspective view of one embodiment of a magnetostatic surface wave delay line which may be used in the instant invention.

The basic configuration of one preferred embodiment of an MSWDL 14 is shown in FIG. 3. A ground plane 28 is formed from a conductive material such as copper, aluminum or the like. On the top surface of the ground plane is a substrate 30 of a dielectric material which may be glass or the like. Deposited on the top surface of the substrate 30 are two open-circuited microstrip couplers 32 and 38. Each of the two microstrip couplers 32 and 38 is approximately L-shaped with the bottom portions of the L disposed perpendicular to the longitudinal direction of the substrate 30 and spaced apart from each other. Couplers 32 and 38 may be formed of any conductive material such as gold, copper or the like. The formation of microstrip couplers is well known in the art.

The end of the microstrip coupler 32 adjacent the remote end of the substrate 30 in FIG. 3 is electrically connected to a suitable conductor, for example the center conductor of a standard coaxial cable connector 36 either directly or by a wire 34. The housing of the coaxial cable connector 36 is electrically connected to the ground plane 28 and preferably also mechanically fastened thereto by screws or other means (not shown) well known to those skilled in the art. Similarly, the end of the microstrip coupler 38 adjacent the near end of the substrate 30 in FIG. 3 is electrically connected to another conductor of appropriate configuration. Threaded holes 42 are provided as one method of fastening and connecting a standard coaxial connector to the ground plane 28.

FIG. 3 shows a slab 44 of material resting on and extending over the top surfaces of the bottom portions of the microstrip couplers 32 and 38. As shown in FIG. 3, the slab 44 is a composite which comprises an upper dielectric substrate portion 46 and a lower ferrite film portion 48. The outer surface of the ferrite film 48 (not visible in FIG. 3) is directly adjacent the microstrip couplers 32 and 38. The dielectric substrate 46 is preferably of gadolinium gallium garnet (GGG). The ferrite film 48 is preferably of yttrium iron garnet (YIG) epitaxially deposited on the GGG substrate 46.

Positioned adjacent to and on opposite sides of the MSWDL 14 are two permanent magnets 50 and 52. Permanent magnet 50 is shown in phantom and broken away to avoid obscuring other details of the MSWDL of FIG. 3. The permanent magnets 50 and 52 are oriented to establish a bias magnetic field having its magnetic field intensity vector H substantially parallel to the plane of the YIG film 48. For the direction of the bias magnetic field intensity vector H indicated in FIG. 3, the direction of propagation for magnetostatic surface waves on the outer surface of the YIG film 48 is in the direction indicated by the vector y, that is, perpendicular to the bias magnetic field intensity vector H and from input microstrip coupler 32 to output microstrip coupler 38. The magnitude of the bias magnetic field intensity H must be at least sufficient to magnetically saturate the YIG film 48 and may be made even higher depending upon the desired frequency of operation for the delay line oscillator 10 (FIGS. 1 and 2). The greater the magnetic field intensity, the higher will be the center frequency of the pass band of the MSWDL 14. For the permanent magnets 50 and 52, samarium cobalt is a preferred material since it provides relatively high magnetic field intensities with conveniently small-sized magnets.

It will be recognized by those skilled in the art that, for convenience, supporting structure required to maintain the various functional elements of the MSWDL 14 in proper spaced relation to each other has been omitted.

Figure 4:
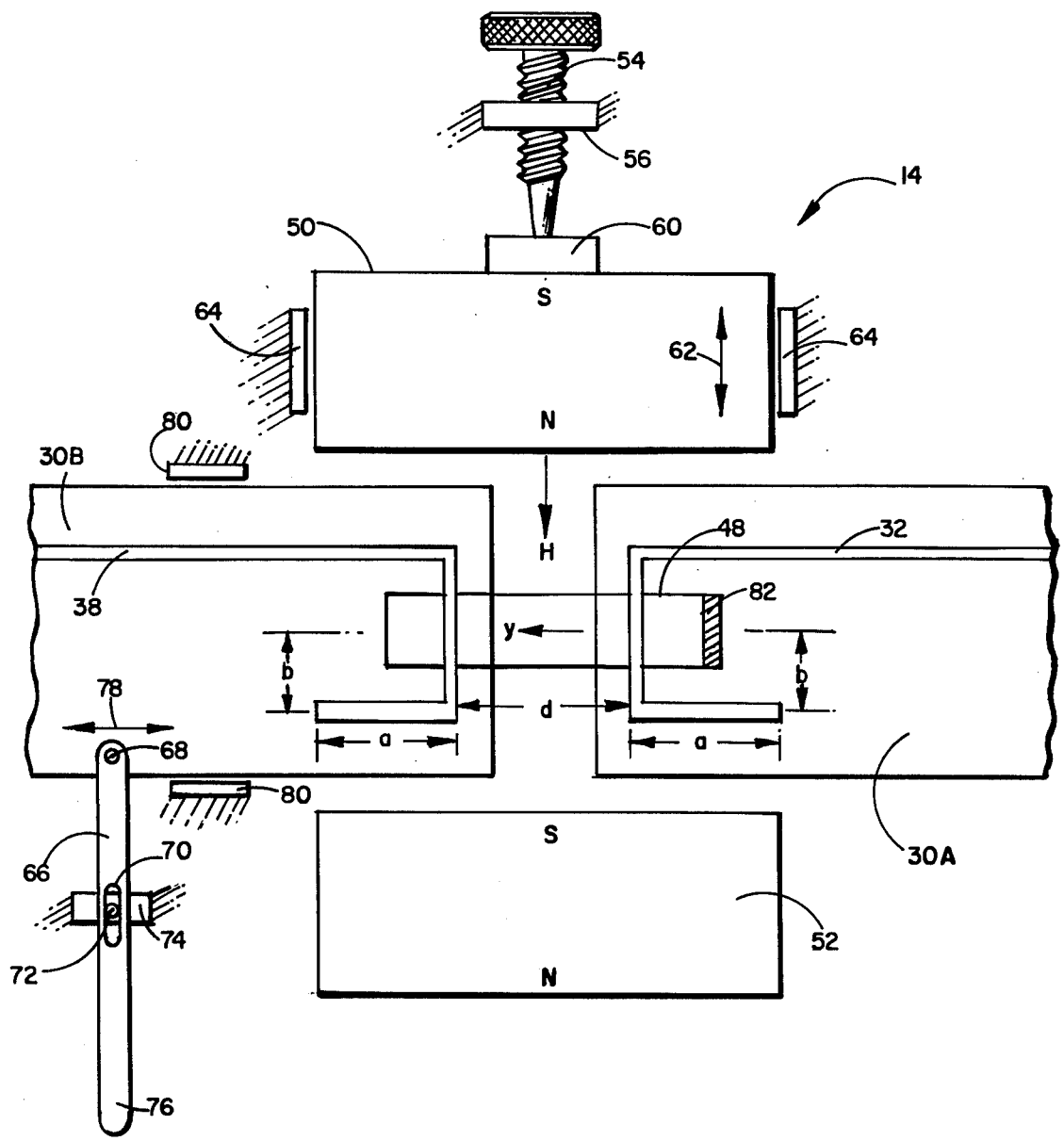
FIG. 4 is a bottom view of a portion of a magnetostatic surface wave delay line having features for tuning an MSWDL oscillator by mechanical means incorporated in the MSWDL.

A more detailed explanation of the operation of an MSWDL 14 adapted for use in an MSWDL oscillator is given in connection with FIG. 4. The view of FIG. 4 represents what would be seen looking up through the glass substrate 30 of FIG. 3 at the microstrip couplers 32 and 38 deposited thereon and also at the outer propagation surface of the YIG film 48. Some changes have been made in FIG. 4 from the embodiment depicted in FIG. 3 as will be discussed more fully hereinafter.

Given that the magnetic field intensity H is sufficient to saturate the YIG film 48, the magnetic dipoles in the YIG will be aligned with the magnetic field intensity vector. These dipoles have a certain rotational velocity or spin. When an rf signal is coupled to the input microstrip coupler 32, an rf current is established therein. At the bottom portion of the microstrip coupler 32, immediately adjacent the YIG film 48, the magnetic field associated with the rf current is perpendicular to the bias magnetic field established by the permanent magnets 50 and 52. This perpendicular magnetic field due to current in the coupler 32 will cause the immediately adjacent spinning magnetic dipoles of the YIG film 48 to precess. This precession disturbance will propagate along the surface of the YIG film 48 as a magnetostatic surface wave thereon at the frequency of the rf signal. When the propagating magnetostatic surface wave reaches the output microstrip coupler 38, an rf signal at the same frequency is established therein. The distance over which the wave is propagated, and thereby delayed by reason of the finite velocity of propagation, is shown as d in FIG. 4.

For maximum coupling of energy to and from the YIG film 48, it is desirable that the rf standing wave established in the microstrip couplers 32 and 38 have a voltage node, that is, a current antinode or maximum, as close to the YIG film 48 as possible. One way to satisfy this condition is to fabricate and microstrip couplers 32 and 38 so that the distance from the open-circuited end (voltage antinode) of each coupler to a point directly under the longitudinal center line of the YIG film 48, the distance a plus b as indicated in FIG. 4, is one-quarter of a wavelength of the standing wave in the microstrip 32 and 38 at the desired frequency of oscillation.

The MSWDL 14 diagrammatically illustrated in FIG. 4 is shown as having means for mechanically varying the magnitude of the bias magnetic field intensity H and, thus, modifying the frequency characteristic or pass band of the MSWDL 14 as mentioned above. A screw 54 is engaged in a threaded hole in a fixed support 56. The screw 54 is adapted to be advanced or retracted by means of a knob 58 at an outer end of the screw 54. At its other end, the screw 54 is journalled for rotation and retained in a second support 60 which is fastened to the permanent magnet 50. As the screw is rotated, the permanent magnet 50 is advanced or retracted along a line indicated by the double-ended arrow 62. Alignment of the magnet 50 is maintained by guides 64 which are also fixed to the base. As is well known, when the magnets 50 and 52 are brought closer together, the magnitude of the bias magnetic field intensity H will increase while the reverse is true when the distance between the magnets 50 and 52 is made greater. The particular mechanism for accomplishing magnetic field intensity variability by mechanical means shown in FIG. 4 is illustrative only. Improvements and refinements thereof will be apparent to those skilled in the art.

The MSWDL 14 illustrated in FIG. 4 is also shown as having means for mechanically varying the length d of the propagation path on the YIG film 48 thereby providing means for tuning the delay line oscillation 10 (FIGS. 1 and 2) to a particular desired frequency of oscillation without changing the frequency characteristic of the delay line. This is possible because neither the input microstrip coupler 32 nor the output microstrip coupler 38 is required to be affixed to (e.g., deposited on) the propagation medium, herein the YIG film 48 of ferromagnetic material. The couplers 32 and 38 are merely required to be closely adjacent to, and preferably in contact with, the propagation surface of the YIG film 48. In FIG. 4, the glass substrate 30 for the microstrip couplers 32 and 38 is segmented into two distinct portions, viz, glass substrate 30A for the input microstrip coupler 32 and glass substrate 30B for the output microstrip coupler 38. The means for varying the length of the propagation path d includes a lever 66 pivotally connected at one of its ends 68 to the glass substrate 30B. An elongated slot 70 at an intermediate location of the lever 66 engages a pivot 72 extending from a fixed base 74. By moving the remote end 76 of the lever, the substrate 30B and the output microstrip coupler 38 can be displaced longitudinally with respect to the YIG film 48 along the direction indicated by the double-ended arrow 78. Alignment of the substrate 30B and the microstrip output coupler 38 is maintained by guides 80 which may be fixed in a suitable manner, including to the ground plane 28 (See FIG. 3). The particular means for adjusting the length of the propagation path shown in FIG. 4 are intended to be illustrative only. Refinements and improvements thereof will be apparent to those skilled in the art.

It will also be apparent that the movement of the microstrip couplers 32 and 38 relative to each other to vary the length d of the propagation path may be accomplished by making the substrate 30A and input microstrip coupler 32 movable instead of the substrate 30B and output microstrip coupler 38. In either case, to prevent uncontrolled movement thereof, it is desirable to have the entire slab of material 44 (see FIG. 3) bearing the YIG film 48 firmly fixed to whichever substrate is intended to remain stationary by, for example, adhesively affixing an end of the YIG film 48 to that substrate. A small amount of epoxy adhesive 82, for example, is shown in FIG. 4 for bonding an end of the YIG film 48 to substrate 30A thereby maintaining the YIG film 48 stationary (relative to substrate 30A) regardless of any forces which may tend to displace it. It should be noted that when the capability of frequency tuning by propagation path length adjustment is provided, the variable phase shifter 26 shown in FIG. 2 may be eliminated from the delay line oscillator 10 inasmuch as the functions thereof are substantially equivalent.

Figure 5:
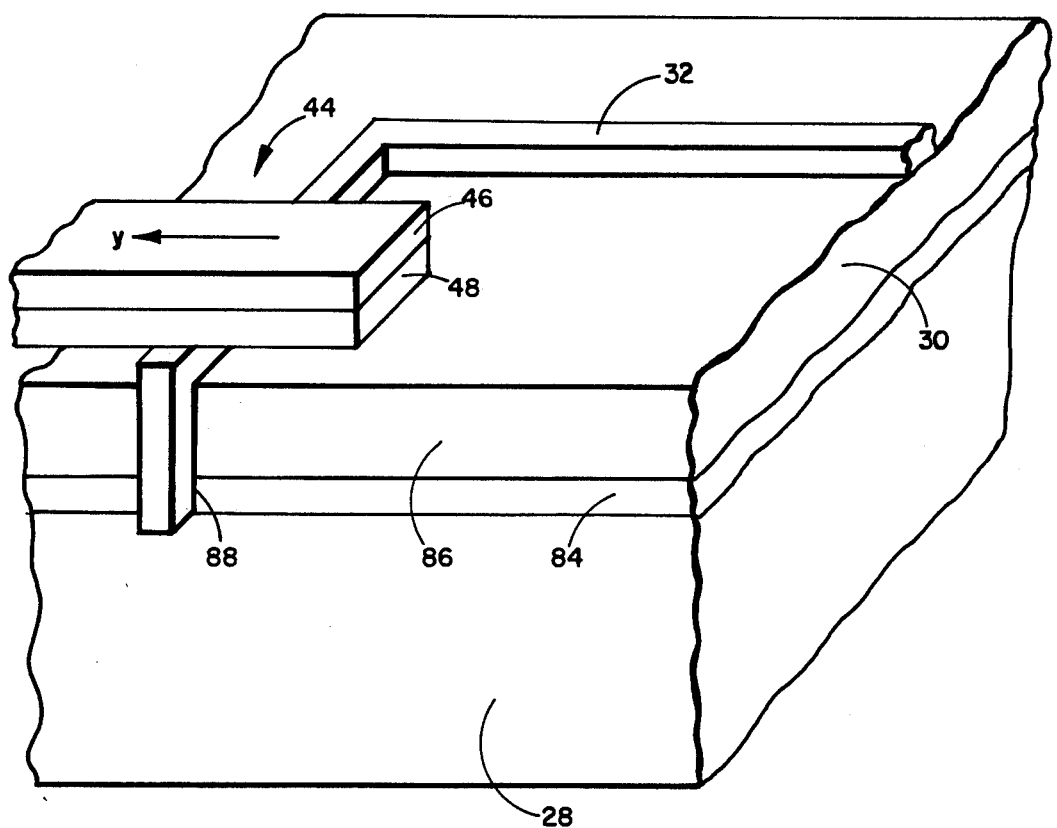
FIG. 5 is a perspective view of a portion of a magnetostatic surface wave delay line cut away to show an alternative termination for a microstrip coupler.

The MSWDL 14 as illustrated in FIG. 4 and as discussed hereinabove employs an open-circuited input microstrip coupler 32 for launching a magnetostatic surface wave in the positive y direction on the surface of the YIG film 48. An open-circuited output microstrip coupler 38 for sensing the propagated wave and establishing a delayed, or phase-shifted, rf signal at the output port of MSWDL 14 is also provided. The embodiment of an MSWDL as illustrated in FIG. 5 is generally less sensitive to changes in frequency. In FIG. 5, input microstrip coupler 32 is deposited on the upper surface of glass substrate 30, the coupler exending beneath the composite slab 44 adjacent the YIG film 48 thereof. A layer of conductive material 84, such as, for example, gold or copper, is formed between substrate 30 and ground plane 28 in any suitable manner. The layer of conductive material 84 is in electrical contact with the ground plane 28. The input microstrip coupler 32 extends to and down the side surface 86 of the substrate 30 where it is electrically connected at end 88 to the conductive layer 84 thereby forming a short-circuited coupler termination. This establishes a current antinode rather than a voltage antinode at the termination of the coupler 32. The physical location of this current antinode, i.e., at the end 88 of the coupler 32, will not vary with frequency. The composite slab 44 is positioned as close as is feasible to the side surface 86 of the substrate 30 for optimal magnetic coupling. A similar structure is used for the output microstrip coupler 38. Since the layer of conductive material 84 need only be in electrical contact with the ground plane 28 and not necessarily connected thereto, movability of a microstrip coupler relative to the surface of the YIG film 48, as was discussed in connection with FIG. 4, is preserved provided the substrate 30 is segmented for the two couplers 32 and 38. Of course, if movability of a coupler is not desired, the coupler end may be connected directly to ground plane 28.

Figure 6:
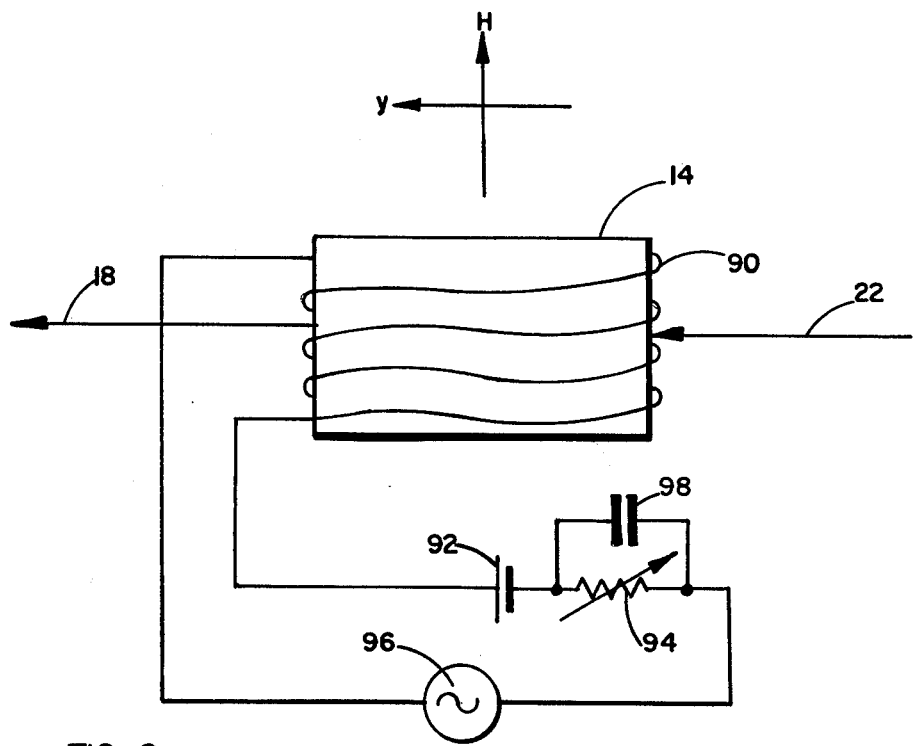
FIG. 6 is a schematic diagram of a magnetostatic surface wave delay line for interconnection in an oscillator circuit wherein the delay line is adapted for tuning the oscillator by electrical means.

FIG. 6 illustrates, schematically, means for varying the frequency of oscillation of a delay line oscillator 10 (see FIGS. 1 and 2) electrically (or electronically). There is shown in FIG. 6 an MSWDL 14 having an input cable 22 coupled to the input microstrip coupler 32 and an output cable 18 coupled to the output microstrip coupler 38 (see FIGS. 1, 2, 3 and 4). The direction of the bias magnetic field intensity established by the permanent magnets 50 and 52 and the direction of propagation of the magnetostatic wave on the YIG film 48 (see FIGS. 3 and 4) are indicated in FIG. 6 by the arrows representing the vectors H and y respectively. For electrical tuning, a coil 90 in the form of a solenoid may be wound around around MSWDL 14, the coil 90 being oriented to produce a tuning magnetic field intensity parallel to the bias magnetic field intensity produced by permanent magnets 50 and 52 (FIGS. 3 and 4). The coil 90, when energized to carry current, produces its own magnetic field which either adds to or subtracts from the bias magnetic field depending upon the direction in which the turns of the coil 90 are wound and the direction of the current therein. This magnetic field variation may be accomplished using either a dc bias source 92 or an rf signal source 96 or both of these together. The dc current produced by the dc bias source 92 may be varied by a potentiometer 94 or the like which may be by-passed by a capacitor 98 to avoid attenuation of an rf signal from the rf signal source 96. The variations in magnetic field intensity produced by the rf signal source 96 will cause corresponding frequency modulation of the output of the delay line oscillator 10.

Test results obtained from an embodiment of the subject invention conforming substantially to that shown in FIGS. 2 and 3, and discussed in connection therewith, have been published by J. Haworth (an inventor herein) in "A Magnetostatic Delay Line Oscillator," 1975 IEEE-MTT-S International Microwave Symposium, IEEE Cat. No. 75CH0955-5, pp. 371–372, May 12–14, 1975. Said published article is hereby incorporated by reference into this specification.

While the invention has been shown and described with reference to certain preferred embodiments thereof, it will be understood by those skilled in the art that various changes in details may be made therein without departing from the spirit and scope of the invention as set forth in the following claims.

What is claimed is:

1. A tunable variable frequency oscillator comprising:
    amplifier means having an input port and an output port for an electrical signal; and
    magnetostatic surface wave delay line means for controlling the frequency of said electrical signal interconnected in a feedback path coupled around said amplifier means from the output port thereof to the input port thereof, said magnetostatic surface wave delay line means comprising:
    a magnetostatic surface wave propagating medium having a substantially planar propagation surface,
    magnetic means for establishing a bias magnetic field having a magnetic field intensity substantially parallel to said propagation surface;
    input microstrip coupling means adjacent said propagation surface for receiving said electrical signal from the output port of said amplifier means and for causing a magnetostatic disturbance on said propagation surface in response to said electrical signal;

said input microstrip coupling means having an orientation with respect to said propagation surface and said magnetic field intensity which causes said magnetostatic disturbance to propagate along said propagation surface in a direction perpendicular to said magnetic field intensity; and output microstrip coupling means adjacent said propagation surface and displaced from said input coupling means for sensing said magnetostatic disturbance propagated thereto from said input coupling means whereby said electrical signal is re-established in said output coupling means for connection to the input port of said amplifier means;

said microstrip coupling means each comprising:
  a ground plane of conductive material;
  a substrate of dielectric material positioned adjacent said ground plane; and
  a narrow strip of conductive material deposited on said substrate wherein said substrate is interposed between said strip of conductive material and said ground plane;

means for moving said magnet means relative to said magnetostatic surface wave propagating medium to vary the intensity of the magnetic field at said magnetostatic surface wave propagating medium to vary the frequency of oscillation of said oscillator;

means for moving at least one of said microstrip couplers with respect to the other of one of said microstrip couplers and said magnetostatic surface wave propagating medium to vary the displacement of said microstrip couplers from each other to vary the frequency of oscillation of said oscillator.

2. An oscillator comprising:

amplifier means having an input port and an output port for an electrical signal;

magnetostatic surface wave delay line means for controlling the frequency of said electrical signal interconnected in a feedback path coupled around said amplifier means from the output port thereof to the input port thereof, said magnetostatic surface wave delay line means comprising;

a magnetostatic surface wave propagating medium having a substantially planar propagation surface;

means for establishing a bias magnetic field having a magnetic field intensity substantially parallel to said propagation surface;

input microstrip coupling means adjacent said propagation surface for receiving said electrical signal from the output port of said amplifier means and for causing a magnetostatic disturbance on said propagation surface in response to said electrical signal;

said input microstrip coupling means having an orientation with respect to said propagation surface and said magnetic field intensity which causes said magnetostatic disturbance to propagate along said propagation surface in a direction perpendicular to said magnetic field intensity;

output microstrip coupling means adjacent said propagation surface and displaced from said input coupling means for sensing said magnetostatic disturbance propagated thereto from said input coupling means whereby said electrical signal is re-established in said output coupling means for connection to the input port of said amplifier means;

said microstrip coupling means each comprising:
  a ground plane of conductive material;
  a substrate of dielectric material positioned adjacent said ground plane; and
  a narrow strip of conductive material deposited on said substrate wherein said substrate is interposed between said strip of conductive material and said ground plane; and means for moving at least one of said microstrip couplers with respect to the other of one of said microstrip couplers and said magnetostatic surface wave propagating medium to vary the displacement of said microstrip couplers from each other to vary the frequency of oscillation of said oscillator.

* * * * *